(12) United States Patent
Kasahara et al.

(10) Patent No.: US 7,494,941 B2
(45) Date of Patent: Feb. 24, 2009

(54) MANUFACTURING METHOD OF SEMICONDUCTOR DEVICE, AND SUBSTRATE PROCESSING APPARATUS

(75) Inventors: Osamu Kasahara, Toyama (JP); Kiyohiko Maeda, Toyama (JP); Akihiko Yoneda, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 207 days.

(21) Appl. No.: 10/571,349

(22) PCT Filed: Nov. 19, 2004

(86) PCT No.: PCT/JP2004/017258

§ 371 (c)(1),
(2), (4) Date: Jul. 12, 2006

(87) PCT Pub. No.: WO2005/050725

PCT Pub. Date: Jun. 2, 2005

(65) Prior Publication Data

US 2007/0032045 A1 Feb. 8, 2007

(30) Foreign Application Priority Data

Nov. 20, 2003 (JP) ............................. 2003-391194

(51) Int. Cl.
*H01L 21/31* (2006.01)
*H01L 21/469* (2006.01)

(52) U.S. Cl. ................. 438/792; 438/935; 438/788; 257/E21.477; 118/723 R; 118/506

(58) Field of Classification Search ................ 438/788, 438/792, 935, 681, 773, 770; 257/E21.477, 257/E21.17, E21.493; 427/96.8, 255.37; 118/723 R, 506

See application file for complete search history.

(56) References Cited

U.S. PATENT DOCUMENTS

| 6,187,102 B1 * | 2/2001 | Yamamoto ................. 118/725 |
| 6,573,178 B1 | 6/2003 | Nakamura |
| 2001/0048981 A1 * | 12/2001 | Suzuki ..................... 427/569 |
| 2002/0029818 A1 * | 3/2002 | Murayama et al. ............. 141/65 |
| 2002/0073923 A1 * | 6/2002 | Saito et al. ................. 118/715 |
| 2002/0094502 A1 | 7/2002 | Kogano et al. |
| 2002/0104206 A1 * | 8/2002 | Hirano ..................... 29/25.02 |

(Continued)

FOREIGN PATENT DOCUMENTS

JP  A 2-52424  2/1990

(Continued)

*Primary Examiner*—Caridad M Everhart
(74) *Attorney, Agent, or Firm*—Oliff & Berridge, PLC

(57) ABSTRACT

At a time of a substrate loading step or/and at a time of a substrate unloading step, particles are effectively eliminated from a reaction chamber.

Provided are a step of loading at least one wafer 200 into a reaction chamber 201, a step of introducing reaction gas into the reaction chamber 201, and exhausting an inside of the reaction chamber 201, thereby processing the wafer 200, and a step of unloading the processed wafer 200 from the reaction chamber 201. In the step of loading the wafer 200 or/and in the step of unloading the wafer 200, the inside of the reaction chamber 201 is exhausted at a larger exhaust flow rate than an exhaust flow rate in the step of processing the wafer 200.

16 Claims, 9 Drawing Sheets

U.S. PATENT DOCUMENTS

2005/0056223 A1 * 3/2005 Lee et al. .................... 118/729

FOREIGN PATENT DOCUMENTS

| JP | A 8-31743 | 2/1996 |
| JP | A 10-326752 | 12/1998 |
| JP | A-2000-100733 | 4/2000 |
| JP | A 2000-100733 | 4/2000 |
| JP | A-2000-306904 | 11/2000 |
| JP | A 2000-306904 | 11/2000 |
| JP | A 2001-77099 | 3/2001 |

* cited by examiner

TEMPERATURE CHANGE AT
LOADING/UNLOADING TIMES

|    | Max.  | Min.  | Range |
|----|-------|-------|-------|
| U  | 781.7 | 769.7 | 12.0  |
| CU | 760.3 | 706.4 | 53.9  |
| CL | 760.7 | 572.9 | 87.8  |
| L  | 765.5 | 874.7 | 90.8  |

MANUFACTURING METHOD OF SEMICONDUCTOR DEVICE, AND SUBSTRATE PROCESSING APPARATUS

TECHNICAL FIELD

The present invention relates to a manufacturing method of a semiconductor device, and to a substrate processing apparatus, and particularly, to a device for eliminating particles in a reaction chamber.

BACKGROUND ART

As a substrate processing apparatus for carrying out one step of a manufacturing process of a semiconductor device (a device), there is a vertical CVD apparatus which performs processing such as film forming for a large number of wafers in a reaction chamber (hereinafter, also referred to as "in a furnace"). In the conventional vertical CVD apparatus, in the semiconductor manufacturing process, in particular, when the reaction chamber is opened, particles scatter from a particle generation source into the furnace, and the particles are prone to be adhered onto a surface of each wafer. The particle generation source is a reaction product adsorbed on a reaction chamber wall, a pipe wall, or the like. The film forming is repeated in the furnace, films of the reaction product are thereby adsorbed on the reaction chamber wall, the pipe wall, or the like, and the films are exfoliated and become particles 92 as shown in FIG. 8. For example, when film forming of a silicon nitride film (a SiN film) is repeated, $Si_3N_4$ films 90 are deposited on the wall surfaces in a high temperature region of 500° C. or more, and ammonium chloride films ($NH_4Cl$ films) 91 are deposited thereon in a low temperature region of 150° C. or less, and these are exfoliated and become the particles 92.

At the time of the film forming step, in FIG. 8, if places on which the $Si_3N_4$ films 90 are prone to be adsorbed are first mentioned, the places are a surface of a quartz-made boat 117, and an inner wall of an inner reaction tube 104 which constructs a quarts-made reaction pipe (hereinafter, also referred to as a "furnace body") 103 with a double-pipe structure, on an outer circumference of which a heater 102 is provided. If places on which the $NH_4Cl$ films 91 are prone to be adhered are mentioned next, the places are a lower outer wall of the inner reaction tube 104 in the vicinity of an exhaust port 111, an inner wall of a metal-made, for example, stainless steel-made manifold 106 to which a supply pipe 132 and an exhaust pipe 112 are connected, an inner wall of the supply pipe 132 which introduces reaction gas into the reaction chamber, an inner wall of the exhaust pipe 112 connected to the exhaust port 111 of the manifold 106, an inner wall of a seal cap 119 which seals a throat opening 116, and the like.

Owing to a fact that the film forming is repeated in the furnace, the $Si_3N_4$ films 90 are deposited on the high temperature regions of the above-described members, and the $NH_4Cl$ films 91 are deposited on the low temperature regions thereof. When the $Si_3N_4$ films 90 deposited in the reaction chamber 101 and the $NH_4Cl$ films 91 deposited on the low temperature regions of the reaction chamber, the manifold, and the pipes are exfoliated, these films become the particles 92. Note that, in the drawing, the SiN ($Si_3N_4$ films) 90, the $NH_4Cl$ films 91, and the particles 92 are drawn emphatically for the sake of convenience.

When the films adsorbed and deposited on the wall surfaces are exfoliated from the wall surfaces owing to some cause, the films become the particles 92. A description will be made of a generation mechanism of the particles by using FIG. 9.

FIG. 9 shows a step (a wafer loading step) of elevating (boat up) the boat 117 having the wafers 100 charged thereon in a direction of an open arrow, and loading the wafers 100 into the reaction chamber 101. When the throat opening 116 is opened, heat radiation from the throat opening 116 toward the outside occurs, and temperature of the furnace body drops.

Moreover, since the wafers 100 and the boat 117, which are at room temperature, are loaded into the reaction chamber 101, temperature of the wall surface of the heated reaction pipe 103 is lowered. Accordingly, the SiN films 90 adhered onto the wall surface of the reaction pipe, and the like, undergo a stress caused by a difference thereof in thermal expansion from the reaction pipe 103, and are exfoliated from the wall surface, and the particles 92 are generated.

Furthermore, also in a (wafer unloading) step of lowering the boat 117 which holds the already processed wafers 100, and unloading the wafers 100 from the reaction chamber 101, the particles are generated owing to a similar mechanism to the above. It is conceived that the particles are generated because of the following reason. Specifically, since the wall surface of the reaction pipe and the manifold are going to be exposed to the outside in a pipe axial direction by the high temperature portion of the boat when the wafers 100 and the boat 117 are unloaded from the reaction chamber 101, in particular, the $NH_4Cl$ films 91 adsorbed on the wall surface of a lower portion of the reaction pipe and an inner wall surface of the manifold, which become the low temperature regions, undergo a stress, and are exfoliated from the wall surfaces, and the particles 92 are generated.

In this connection, in order to prevent contamination of the wafers by the above-described particles, heretofore, there have been proposed a method of back-purging and slowly exhausting the reaction chamber at the times of wafer loading/wafer unloading (for example, refer to Patent Document 1), and a method of introducing inert gas into the reaction chamber and slowly exhausting the reaction chamber in a state where the reaction chamber is opened (for example, refer to Patent Document 2).

Patent Document 1: Japanese Patent Laid-Open Publication No. H10-326752 (published in 1998)

Patent Document 2: Japanese Patent Laid-Open Publication No. H8-31743 (published in 1996)

DISCLOSURE OF THE INVENTION

Problems to be Solved by the Invention

However, according to the methods of exhausting the reaction chamber by the slow exhaust at the times of wafer loading/wafer unloading or at the time of opening the reaction chamber, which are as described in Patent Documents 1 and 2, an effective airflow for removing the particles cannot be formed, and accordingly, there is room for improvement.

It is an object of the present invention to provide a manufacturing method of a semiconductor device, and a substrate processing apparatus, which are capable of effectively eliminating the particles from the reaction chamber.

Means for Solving the Problems

A first invention is a method of manufacturing a semiconductor device, comprising the steps of: loading at least one substrate into a reaction chamber; introducing reaction gas into the reaction chamber, and exhausting an inside of the reaction chamber, thereby processing the substrate; and unloading the processed substrate from the reaction chamber, wherein, in the step of loading the substrate or/and in the step of unloading the substrate, the inside of the reaction chamber is exhausted at a larger exhaust flow rate than an exhaust flow rate in the step of processing the substrate.

In the step of loading the substrate or/and in the step of unloading the substrate, a temperature change of the reaction chamber wall occurs, and the deposited films adhered onto the reaction chamber wall are exfoliated from the reaction chamber wall owing to a stress caused by a difference in thermal expansion between the deposited films and the reaction chamber wall, and become the particles. When the inside of the reaction chamber is exhausted at the larger exhaust flow rate than the exhaust flow rate in the step of processing the substrate, the effective airflow for removing the particles can be formed, and accordingly, the particles are effectively emitted to the outside of the reaction chamber. Hence, the adhesion of the particles onto the substrates can be reduced.

A second invention is the method of manufacturing a semiconductor device in the first invention, wherein, in the step of loading the substrate or/and in the step of unloading the substrate, the inside of the reaction chamber is exhausted at the larger exhaust flow rate than the exhaust flow rate in the step of processing the substrate while introducing inert gas into the reaction chamber.

When the inside of the reaction chamber is exhausted at the larger exhaust flow rate than the exhaust flow rate in the step of processing the substrate while introducing the inert gas into the reaction chamber, the effective airflow for removing the particles can be formed. Accordingly, the particles can be effectively emitted to the outside of the reaction chamber. Hence, the adhesion of the particles onto the substrates can be reduced.

In this case, with regard to the inert gas for use, when a particle size is as large as 0.5 μm or more, other gas than $N_2$, such as Ar, of which molecules are larger than those of $N_2$, may be used. However, when the particle size is an order of 0.1 μm to 0.5 μm, it is preferable to use $N_2$ for the most common use.

A third invention is a method of manufacturing a semiconductor device, comprising the steps of: loading at least one substrate into a reaction chamber; introducing reaction gas into the reaction chamber, and exhausting an inside of the reaction chamber by a first exhaust line communicating with a vacuum pump, thereby processing the substrate; and unloading the processed substrate from the reaction chamber, wherein, in the step of loading the substrate or/and in the step of unloading the substrate, the inside of the reaction chamber is exhausted by a second exhaust line having a larger exhaust flow rate than the first exhaust line.

When the inside of the reaction chamber is exhausted by the second exhaust line having the larger exhaust flow rate than the first exhaust line, the effective airflow for removing the particles can be formed, and accordingly, the particles can be effectively emitted to the outside of the reaction chamber. Hence, the adhesion of the particles onto the substrates can be reduced.

It is recommended that the second exhaust line be adapted not to perform vacuum exhaust but to perform atmospheric pressure exhaust. In the case of the atmospheric pressure exhaust, the particles can be emitted more effectively as compared with the vacuum exhaust.

A fourth invention is the method of manufacturing a semiconductor device in the third invention, wherein, in the step of loading the substrate or/and in the step of unloading the substrate, the inside of the reaction chamber is exhausted by the second exhaust line having the larger exhaust flow rate than the first exhaust line while introducing inert gas into the reaction chamber.

When the inside of the reaction chamber is exhausted by the second exhaust line having the larger exhaust flow rate than the first exhaust line while introducing the inert gas into the reaction chamber, the effective airflow for removing the particles can be formed, and accordingly, the particles can be effectively emitted to the outside of the reaction chamber. Hence, the adhesion of the particles onto the substrates can be reduced.

A fifth invention is the method of manufacturing a semiconductor device in the third invention, further comprising the step of purging the inside of the reaction chamber with the inert gas after the substrate is unloaded therefrom, wherein the inside of the reaction chamber is exhausted by the second exhaust line having the larger exhaust flow rate than the first exhaust line while introducing the inert gas into the reaction chamber continuously during a period from the step of unloading the substrate until an end of the step of purging the inside of the reaction chamber.

When the inside of the reaction chamber is exhausted by the second exhaust line having the larger exhaust flow rate than the first exhaust line while introducing the inert gas into the reaction chamber continuously during the period from the step of unloading the substrate until the end of the step of purging the inside of the reaction chamber, the particles can be effectively emitted to the outside of the reaction chamber.

A sixth invention is the method of manufacturing a semiconductor device in the third invention, wherein the second exhaust line communicates with exhaust equipment of a building-accompanying facility. The emission can be performed by using, as the second exhaust line, the exhaust equipment having a large flow rate, which is incorporated in the building-accompanying facility. Accordingly, the exhaust at the larger exhaust flow rate than the exhaust flow rate of the first exhaust line can be obtained surely and easily.

A seventh invention is the method of manufacturing a semiconductor device in the third invention, wherein, in the step of processing the substrate, a silicon nitride film is deposited on the substrate. When the step of processing the substrate is one to deposit the silicon nitride film on the substrate, the particles formed of the silicon nitride film and the ammonium chloride film, which are deposited in the reaction chamber and are exfoliated therefrom, can be effectively emitted to the outside of the reaction chamber.

An eighth invention is the method of manufacturing a semiconductor device in the fourth invention, wherein a flow rate of the inert gas is set at 100 times or more a flow rate of the reaction gas. Based on the experience value, it is preferable to set the flow rate of the inert gas at 100 times or more the flow rate of the reaction gas.

A ninth invention is the method of manufacturing a semiconductor device in the fourth invention, wherein a flow rate of the inert gas is 100 L/min or more. It is preferable that the flow rate of the inert gas be 100 L/min or more in order to smoothly move the particles out of the reaction chamber against the gravity of the particles.

A tenth invention is the method of manufacturing a semiconductor device in the fourth invention, wherein a flow rate of the inert gas is 100 L/min to 200 L/min. Because of the reason that the particles are to be smoothly moved out of the reaction chamber and that heat in the reaction chamber is not to be taken away too much, it is more preferable that the flow rate of the inert gas be 100 to 200 L/min. In particular, when an upper limit of the flow rate of the inert gas is set at 150

L/min, facility cost can be suppressed from being expensive, and in addition, the heat in the reaction chamber can be adapted not to be taken away too much.

An eleventh invention is the method of manufacturing a semiconductor device in the fourth invention, wherein the exhaust flow rate of the second exhaust line is larger than a supply flow rate of the inert gas. Note that the atmosphere is absorbed into the reaction chamber when the exhaust flow rate of the second exhaust flow line exceeds the flow rate of the inert gas. Accordingly, when it is not desired that oxide films be formed on the substrates, it is recommended to set the exhaust flow rate of the second exhaust line to be substantially equal to the flow rate of the inert gas. However, when the oxide films may be formed on the substrates, it is preferable that the exhaust flow rate of the second exhaust flow line be larger than the flow rate of the inert gas because the particles can be emitted to the outside of the reaction chamber more effectively.

A twelfth invention is the method of manufacturing a semiconductor device in the fourth invention, wherein the inert gas is heated and introduced into the reaction chamber. When the inert gas is heated and introduced into the reaction chamber, the change of the temperature in the reaction chamber can be suppressed even in the substrate loading step or/and in the substrate unloading step. Accordingly, a crack of the deposited films owing to the lowering of the reaction chamber temperature can be restricted from being generated, and the generation of the particles can be further suppressed.

In particular, when the heating temperature of the inert gas is approximately at the temperature in the reaction chamber, the change of the temperature in the reaction chamber can be further suppressed even in the substrate loading step or/and in the substrate unloading step, and accordingly, the generation of the particles can be further suppressed.

A thirteenth invention is a substrate processing apparatus, comprising: a reaction chamber which performs processing for at least one substrate; at least one gas supply line which introduces gas into the reaction chamber; a first exhaust line which exhausts an inside of the reaction chamber by a vacuum pump; a second exhaust line having a larger exhaust flow rate than the first exhaust line which exhausts the inside of the reaction chamber; and a controller which makes a control to exhaust the inside of the reaction chamber by the second exhaust line at a time of loading the substrate into the reaction chamber or/and at a time of unloading the substrate from the reaction chamber. When there is provided the controller which performs the exhaust by the second exhaust line having the larger exhaust flow rate than the first exhaust line which exhausts the inside of the reaction chamber at the time of loading the substrate into the reaction chamber or/and at the time of unloading the substrate from the reaction chamber, the particles generated in the reaction chamber can be emitted easily.

A fourteenth invention is the substrate processing apparatus in the thirteenth invention, wherein the controller makes the control to exhaust the inside of the reaction chamber by the second exhaust line while introducing inert gas from the gas supply line into the reaction chamber at the time of loading the substrate into the reaction chamber or/and at the time of unloading the substrate from the reaction chamber.

When there is provided the controller which performs the exhaust by the second exhaust line having the larger exhaust flow rate than the first exhaust line while introducing the inert gas from the gas supply line into the reaction chamber at the time of loading the substrate into the reaction chamber or/and at the time of unloading the substrate from the reaction chamber, the particles generated in the reaction chamber can be emitted easily.

For example, when the substrate processing apparatus uses a holding jig (a substrate holder such as the boat) in order to load the substrate into the reaction chamber, the time when the reaction chamber is opened is mainly composed of the substrate loading step of loading the substrate held by the holder into the reaction chamber, and of the substrate unloading step of unloading the processed substrate held by the holder from the reaction chamber. As in the present invention, when the period while the exhaust is being performed by the second exhaust line while introducing the inert gas from the gas supply line into the reaction chamber is limited to the substrate loading time or/and the substrate unloading time, a period while the second exhaust line is being exposed to emitted heat is shortened as compared with the case of performing the exhaust by the second exhaust line while introducing the inert gas from the gas supply line into the reaction chamber continuously during all the period while the reaction chamber is being opened. Accordingly, the members constructing the exhaust line can be protected. Moreover, when the period while the exhaust is being performed by the second exhaust line while introducing the inert gas from the gas supply line into the reaction chamber is limited to the time of the substrate loading step or/and the time of the substrate unloading step, a consumption of the inert gas can be reduced.

A fifteenth invention is the substrate processing apparatus in the thirteenth invention, wherein the controller further makes a control to exhaust the inside of the reaction chamber by the second exhaust line while introducing inert gas from the gas supply line into the reaction chamber continuously during a period from the time of unloading the substrate until an end of purging of the reaction chamber, the purging being performed after the substrate is unloaded.

When the control is made by the controller to exhaust the inside of the reaction chamber by the second exhaust line while introducing the inert gas into the reaction chamber continuously during the period from the time of unloading the substrate until the end of the purging of the reaction chamber, the particles can be emitted to the outside of the reaction chamber more effectively.

A sixteenth invention is the substrate processing apparatus in the thirteenth invention, wherein the second exhaust line communicates with exhaust equipment of a building-accompanying facility.

When the second exhaust line communicates with the building-accompanying facility, the emission can be performed by using exhaust equipment of which exhaust flow rate is large. Accordingly, the exhaust of which exhaust flow rate is larger than that of the first exhaust line can be performed surely and easily.

A seventeenth invention is the substrate processing apparatus in the thirteenth invention, further comprising a holder which charges a plurality of the substrates in a horizontal attitude at multi-stages in the reaction chamber. The inside of the reaction chamber is exhausted from the second exhaust line of which exhaust flow rate is large. Accordingly, the particles can be effectively emitted even from such a large-capacity reaction chamber as housing the holder on which the substrates are charged at the multi-stages. Therefore, the adhesion of the particles onto the substrates can be reduced at any stage of the holder.

An eighteenth invention is the substrate processing apparatus in the thirteenth invention, wherein the reaction chamber is composed of an outer reaction tube and an inner reaction tube.

In order to emit the particles generated in the inner reaction tube to the outside of the furnace, it is necessary to elevate the particles against the gravity, and it is therefore difficult to emit the particles. However, according to the present invention, the exhaust is performed by the second exhaust line of which exhaust flow rate is large. Accordingly, the particles can be easily emitted even from the reaction chamber composed of the outer reaction tube and the inner reaction tube.

A nineteenth invention is the substrate processing apparatus in the thirteenth invention, wherein a preliminary chamber which leaves the substrate on standby is conjoined to the reaction chamber. Since the preliminary chamber is conjoined to the reaction chamber, the substrates can be loaded and unloaded without leaving the reaction chamber open to the atmosphere at the time when the reaction chamber is opened. In particular, when a function to introduce the inert gas is provided in the preliminary chamber, the inert gas can be introduced from the preliminary chamber into the reaction chamber in combination with the gas supply line or without using the gas supply line. For example, the above-described preliminary chamber is a load-lock chamber or a $N_2$ purge box.

A twentieth invention is the substrate processing apparatus in the fourteenth invention, wherein the gas supply line includes a line for reaction gas, and a line for the inert gas, and the inert gas is introduced from the line for the inert gas. Since the inert gas is introduced from the line for the inert gas, the stress caused by the introduction of the inert gas can be adapted not to be applied to the deposited films adhered onto the line for the reaction gas. Hence, the crack of the deposited films adhered onto the line for the reaction gas can be restricted from being generated.

Effect of the Invention

According to the method of the present invention, in the step of loading the substrate or/and in the step of unloading the substrate, the inside of the reaction chamber is exhausted at the larger exhaust flow rate than the exhaust flow rate in the step of processing the substrate. Accordingly, the particles can be effectively emitted from the reaction chamber, and the adhesion of the particles onto the substrates can be reduced.

Moreover, according to the apparatus of the present invention, there is provided the controller which performs the exhaust by the second exhaust line having the larger exhaust flow rate than the first exhaust line which exhausts the inside of the reaction chamber at the time of loading the substrate into the reaction chamber or/and at the time of unloading the substrate from the reaction chamber. Accordingly, the particles can be effectively emitted from the reaction chamber, and the adhesion of the particles onto the substrates can be reduced.

BEST MODE FOR CARRYING OUT THE INVENTION

A description will be made below of a manufacturing method of a semiconductor device of the present invention, and of a substrate processing apparatus for carrying out the manufacturing method. Note that, when the substrate processing apparatus is a vertical device, boat loading, which is an operation of elevating a boat having wafers charged thereon and of loading the boat in a furnace, corresponds to wafer loading (substrate loading). Moreover, boat unloading, which is an operation of lowering the boat having the wafers charged thereon and of unloading the boat from the furnace, corresponds to wafer unloading (substrate unloading). Since a vertical CVD apparatus will be described in the following description, the term "wafer loading" and the term "boat loading" will be used in the same meaning. Moreover, the term "wafer unloading" and the term "boat unloading" will be used in the same meaning.

The inventor of the present invention investigated as to which extent temperature (furnace temperature) of a wall surface of a reaction pipe was changed in a wafer loading step and a wafer unloading step in a semiconductor manufacturing process. This will be described by using FIG. 10. FIG. 10 shows changes of the furnace temperature, which occur in the wafer loading step accompanied with the boat elevation and the wafer unloading step accompanied with the boat lowering. In the drawing, reference symbols U, CU, CL, and L denote temperature transition curves in an upper portion, upper center portion, lower center portion, and lower portion of the furnace, respectively. Although film forming temperature is set at 750° C., a temperature gradient is formed in the furnace, and accordingly, temperatures of U, CU, CL and L portions are different from one another, and the temperature in the furnace is lower as the portions go downward. It is seen that, since a boat 117 at normal temperature is loaded into the furnace at the time of the boat elevation, a large temperature drop temporarily occurs in the furnace somewhat late from loading timing. Moreover, it is seen that, since the boat 117 at high temperature is unloaded from the furnace at the time of lowering the boat, the CU, CL and L portions which are other than the U portion and are lower in temperature than the U portion receive radiant heat from the high-temperature boat 117, and raise the temperatures of their own on the contrary.

The following is seen from a table written in combination in FIG. 10. Specifically, a temperature difference between the highest temperature and lowest temperature of the U portion remains at 12.0° C. at the times of the wafer loading and the wafer unloading, when the reaction chamber is opened; however, in the CU, CL and L portions, such temperature differences thereof become larger, such as 53.9° C., 87.8° C., and 90.8° C., as the portions go from the CU portion toward the L portion. The wall surface of the reaction pipe undergoes such a large temperature change at the times of the wafer loading and the wafer unloading. Accordingly, a heat stress applied to films on the wall surface is increased, a film crack occurs, and the films are exfoliated from the wall surface. When the films are exfoliated, the films become particles, scatter, and are adhered onto wafers in the reaction chamber 101, resulting in contamination of the wafers. Also at the time of a film forming step, the particles are sometimes adhered onto surfaces of the wafers owing to backflow and diffusion thereof; however, the inventor of the present invention obtained findings that the contamination owing to the adhesion at the times of the wafer loading and the wafer unloading was the most.

Moreover, the inventor of the present invention obtained findings that a main particle generation source was films adhered onto an inner reaction tube at the time of the wafer loading, and was films adhered onto the boat at the time of the wafer unloading.

Note that film forming conditions at the time when furnace temperature characteristics of FIG. 10 were obtained are as follows.

Film type: SiN
Film forming gas $SiH_2Cl_2$: 30 to 100 sccm $NH_3$: 300 to 900 sccm
Film forming temperature: 680 to 800° C.
Pressure: 10 to 100 Pa
Number of wafers loaded on boat: 200 or less
Wafer diameter: Ø200 mm or more The inventor of the present invention accomplished the present invention based on the above-described findings. A description will be made below of embodiments of the present invention.

The substrate processing apparatus includes a processing furnace having a reaction chamber which processes substrates, and is constructed to house a substrate holding member having the substrates charged thereon in the processing furnace, thereby processing the substrates. This processing furnace is illustrated in FIG. 1.

FIG. 1 is a cross-sectional view of a reduced-pressure CVD processing furnace according to a first embodiment. An outer reaction tube 205 is composed of a heat-resistant material, for example, such as quartz ($SiO_2$), and has a cylindrical form in which an upper end is closed and an opening is provided on a lower end. An inner reaction tube 204 has a cylindrical form having openings on both upper and lower ends thereof, and is disposed in the outer reaction tube 205 coaxially therewith. A space between the outer reaction tube 205 and the inner reaction tube 204 forms a cylindrical space 210 serving as a gas passage. Gas elevated from the upper opening of the inner reaction tube 204 is adapted to pass through the cylindrical space 210, and to be exhausted from an exhaust line 260.

A heating device 202 composed of a resistance heating heater or the like is disposed on an outer circumference of the outer reaction tube 205 coaxially therewith. The heating device 202 is controlled by a controller 120 so as to set temperature in the outer reaction tube 205 at a predetermined processing temperature. The above-described inner reaction tube 204 and outer reaction tube 205 and a manifold 209 to be described later construct a reaction chamber 201 for housing and processing wafers 200 as substrates supported by a boat 217 to be described later.

The manifold 209 formed of, for example, stainless steel or the like is engaged with the lower ends of the outer reaction tube 205 and the inner reaction tube 204. The outer reaction tube 205 and the inner reaction tube 204 are held on the manifold 209. Annular flanges are provided individually on the lower end of the outer reaction tube 205 and an upper opening end of the manifold 209. Between these flanges, a hermetically sealing member (hereinafter, an O-ring 220) is disposed, and both of the flanges are hermetically sealed.

An annular flange is provided on a lower end opening (hereinafter, referred to as "a throat opening") of the manifold 209. A disc-like cap member (hereinafter, a seal cap 219) made of, for example, stainless steel or the like is attached onto the flange through a hermetically sealing member (hereinafter, an O-ring 220a) so as to be capable of hermetically sealing the flange and to be freely detachable therefrom. Moreover, in the throat opening of the manifold 209, a throat shutter 218 is provided, and is set capable of freely opening and closing the throat opening in place of the seal cap 219 in a state where the boat 217 is unloaded from the reaction chamber 201. The throat shutter 218 is opened when the wafers are loaded, and is closed after the wafer loading is finished.

Rotating means 211 is coupled to the seal cap 219, and rotates a substrate holding member (hereinafter, a boat 217) and the wafers 200 held on the boat 217. Moreover, the seal cap 219 is coupled to elevating means 213, and elevates and lowers the boat 217. A control is made by the controller 120 so as to set rotation speeds of a rotation shaft 212 and the boat 217 by the rotating means 211 and an elevating speed of the boat 217 by the elevating means 213 at predetermined speeds.

On the lower portion of the manifold 209, a gas introduction line 240 is provided. The gas introduction line 240 includes a gas supply pipe 232. By the gas supply pipe 232, processing gas (reaction gas) or inert gas is adapted to be introduced into the inner reaction tube 204 and the outer reaction tube 205. The gas supply pipe 232 is coupled to gas flow rate controlling means (hereinafter, a mass flow controller (MFC) 231). The MFC 231 is connected to the controller 120, and is capable of controlling a flow rate of the introduced gas at a predetermined rate.

On an upper portion on an opposite side to the lower portion of the manifold 209, on which the gas introduction line 240 is provided, the above-described exhaust line 260 is provided. The exhaust line 260 is composed mainly of a first exhaust line 261 and a second exhaust line 262. Here, the second exhaust line 262 is provided in a form branched from the first exhaust line 261.

The first exhaust line 261 communicates with an exhaust device (hereinafter, a vacuum pump 246), and is adapted to exhaust the reaction gas introduced from the gas introduction line 240 into the reaction chamber 201. The second exhaust line 262 communicates with large-scale exhaust equipment, and is adapted to exhaust a large amount of the inert gas introduced from the gas introduction line 240 into the reaction chamber 201. Note that, as the inert gas introduced from the gas introduction line 240 into the reaction chamber 201, for example, $N_2$ gas, He gas, Ar gas, and the like, are used.

An exhaust flow rate of the gas exhausted from the second exhaust line 262 is set larger than an exhaust flow rate of the gas exhausted from the first exhaust line 261. Therefore, the second exhaust line 262 is connected to, for example, exhaust equipment of a building-accompanying facility, and the like. Moreover, when the inert gas introduced from the gas introduction line 240 into the reaction chamber 201 is exhausted from the second exhaust line 262, the flow rate thereof is set at 20 to 100 times or more the flow rate of the reaction gas.

The above-described first exhaust line 261 is composed of a main exhaust line (a main exhaust line) 263 for performing main exhaust processing, a pressure adjusting line 264 for introducing the inert gas from the main exhaust line 263 side and adjusting pressure in the reaction chamber 201, a slow exhaust line 265 for performing slow exhaust processing, and an overpressurization prevention line 251 for preventing the pressure in the reaction chamber 201 from reaching pressure (overpressure) exceeding the atmospheric pressure. Here, the pressure adjusting processing by the pressure adjusting line 264 is executed when the reaction chamber is closed. The slow exhaust processing by the slow exhaust line 265 is executed when vacuum exhaust processing (evacuation processing) after the wafer loading processing is started. The overpressurization prevention processing by the overpressurization prevention line 251 is executed at the time of returning the pressure in the reaction chamber 201 to the atmospheric pressure, such returning being performed subsequently to purging of the reaction chamber after the wafers are processed.

The above-described first exhaust line 261 includes a main exhaust pipe 1A. One end of the main exhaust pipe 1A is connected to the manifold 209. To the other end of the main exhaust pipe 1A, a turbo molecular pump 246A and a dry pump 246B, which construct the vacuum pump 246, are sequentially connected from an upstream side toward a downstream side. A main exhaust valve 1B is inserted into the main exhaust pipe 1A.

The above-described pressure adjusting line 264 includes a pressure adjusting line 2A. One end of the pressure adjusting pipe 2A is connected to the main exhaust pipe 1A. A connected position of the one end is set between the main exhaust valve 1B and the vacuum pump 246. The other end communicates with an inert gas source, for example, a $N_2$ gas source.

A piezo valve 2C which controls a flow rate of the $N_2$ gas is inserted into the pressure adjusting pipe 2A through a gate valve 2B.

The above-described slow exhaust line 265 includes a slow exhaust pipe 3A. One end of the slow exhaust pipe 3A is connected to the main exhaust pipe 1A on an upstream side of the main exhaust valve 1B. The other end is connected to the main exhaust pipe 1A on a downstream side of the main exhaust valve 1B. A gate valve 3B is provided on the slow exhaust pipe 3A.

The above-described overpressurization prevention line 251 includes a pressure detector 250, and an overpressurization prevention pipe 5A. One ends of the pressure detector 250 and the overpressurization prevention pipe 5A are connected to the main exhaust pipe 1A on the upstream side of the main exhaust valve 1B. The other end of the overpressurization prevention pipe 5A is closed by a check valve 253 through a gate valve 252.

The main exhaust pipe 1A communicating with the vacuum pump 246 emits the gas flowing through the cylindrical space 210 between the outer reaction tube 205 and the inner reaction tube 204, and makes a control so as to set the inside of the outer reaction tube 205 at a reduced-pressure atmosphere with a predetermined pressure. This control is made by the controller 120 which operates the main exhaust valve 1B, the gate valve 2B, the piezo valve 2C, and the gate valve 3B.

The above-described second exhaust line 262 is composed of a high flow vent line (hereinafter, referred to as "an HFV line") 266 as a general exhaust line for performing large-amount exhaust processing. Unlike the vacuum exhaust line which performs the evacuation by the vacuum pump, the HFV line is an exhaust line which performs the exhaust under the atmospheric pressure. The HFV line 266 includes a sub-exhaust pipe 4A. One end of the sub-exhaust pipe 4A is connected to the main exhaust pipe 1A. A connected position of the one end is set on the upstream side of the main exhaust valve 1B. A gate valve 4B is provided on the sub-exhaust pipe 4A. The controller 120 which operates the gate valve 4B makes a control so as to form a large airflow, which goes from the gas supply pipe 232 toward the sub-exhaust pipe 4A, in the reaction chamber 201.

A period while the control is being made so as to exhaust the large amount of inert gas from the HFV line 266 while introducing the inert gas from the gas introduction line 240 into the reaction chamber 201 can be set at the entire period while the reaction chamber 201 is being opened. However, here, the period is limited to a period of the wafer loading step of loading the wafers 200 into the reaction chamber 201 and to a period of the wafer unloading step of unloading the already processed wafers 200 from the reaction chamber 201. Moreover, during these periods, the controller 120 functions so as (1) to flow the large amount of inert gas, (2) to allow the HFV line 266 to exhaust the inert gas therethrough, and (3) to control the flow rate of the inert gas.

Here, if features of the HFV line 266 will be described in summary, the following is mentioned. The HFV line 266 is an exhaust line different from the main exhaust line 263 communicating with the vacuum pump 264, and from the slow exhaust line 265, and the overpressurization prevention line 251, which are provided branched from the main exhaust line 263. The HFV line 266 is provided branched from the main exhaust line 263, and communicates with the exhaust equipment of the building-accompanying facility. The HFV line 266 is set so that an exhaust flow rate thereof can be larger than those of the main exhaust line 263, the slow exhaust line 265, and the overpressurization prevention line 251, and can flow the gas at a large flow rate under the atmospheric pressure. An inner diameter of the HFV line 266 is smaller than an inner diameter of the main exhaust line 263 and larger than inner diameters of the slow exhaust line 265 and the overpressurization prevention line 251.

A description will be made of an example of a reduced-pressure CVD processing method by the processing furnace shown in FIG. 1. First, the boat 217 is lowered by the elevating means (boat down). When the boat 217 completely comes out of the furnace, the throat shutter 218 is closed, and the throat opening of the reaction chamber 201 is thereby closed. The plurality of wafers 200 are charged on the boat 217 by carrying means (not shown) (wafer charging). Subsequently, the temperature in the reaction chamber 201 is set at the predetermined processing temperature while heating the inside of the reaction chamber 201 by the heating means 202. The inert gas is supplied into the reaction chamber 201 from the gas supply pipe 232, the reaction chamber 201 is thereby filled with the inert gas in advance. After opening the throat shutter 218, the boat 217 having the wafers 200 charged thereon is elevated by the elevating means (boat up), the wafers 200 are loaded in the reaction chamber 201 (wafer loading), and the inner temperature of the reaction chamber 201 is maintained at the predetermined processing temperature. After performing the slow exhaust for the inside of the reaction chamber 201 by the slow exhaust line 265, the inside of the reaction chamber 201 is exhausted to a predetermined vacuum state by the first exhaust line 261. Thereafter, the rotation shaft 212, the boat 217, and the wafers 200 charged on the boat 217 are rotated by the rotating means 211.

The reaction gas is introduced from the gas supply pipe 232 in a state where the wafers are rotated. The reaction gas thus introduced is elevated in the reaction chamber 201, and is exhausted through the first exhaust line 261 while being uniformly introduced to the plurality of wafers 200, thereby performing the reduced-pressure CVD processing for a predetermined time.

When the reduced-pressure CVD processing is ended, in order to proceed to the reduced-pressure CVD processing for the next wafers 200, the gas in the reaction chamber 201 is replaced by the inert gas, and the pressure is set at normal pressure. Thereafter, the boat 217 is lowered by the elevating means (boat down), and the boat 217 and the processed wafers 200 are unloaded from the reaction chamber 201 (wafer unloading). When the boat 217 completely comes out of the furnace, the throat shutter 218 is closed, and the throat opening of the reaction chamber 201 is thereby closed. The processed wafers 200 on the boat 217 unloaded from the reaction chamber 201 are cooled to temperature at which it is possible to carry the wafers 200 (cooling), and are thereafter collected by carrying means (not shown) (wafer discharging). The unprocessed wafers 200 are charged on the boat 217 which has become vacant (wafer charging), and again in a similar way to the above, the throat shutter 218 is opened, the boat 217 is elevated and loaded in the reaction chamber 201 (boat up, wafer loading), and the reduced-pressure CVD processing is then performed.

Incidentally, at the times of the wafer loading and the wafer unloading in the above-described reduced-pressure CVD processing process, phenomena as described above occur. Specifically, at the time when the reaction chamber is opened, the temperature drop in the reaction chamber occurs. Moreover, when the wafers 200 and the boat 217, which are at the room temperature, are inserted into the furnace at the time of the wafer loading, the temperature drop occurs on the wall surfaces of the reaction pipes, and the like. Therefore, the deposited films adhered onto the wall surfaces of the reaction pipes, and the like, are exfoliated owing to the stress caused by the difference thereof in coefficient of thermal expansion from the reaction pipes and the like, and scatter as the particles. The particles which have scattered are adhered onto the wafers 200. Moreover, also at the time of the wafer unloading, in a similar way to the time of the wafer loading, the films are exfoliated owing to the stress caused by the temperature change of the furnace body, and the particles are generated and adhered onto the wafers 200.

Accordingly, in this first embodiment, in order to prevent the scattered particles from being adhered onto the wafers 200 at the times of the wafer loading and the wafer unloading, the inert gas, for example, the $N_2$ gas at the large flow rate is adapted to flow in the furnace from the gas introduction side to the exhaust side.

At the time of the wafer loading, the large amount of $N_2$ gas controlled by the MFC 231 is introduced from the gas supply pipe 232 (the gas introduction line 240) into the inner reaction tube 204. The introduced $N_2$ gas is elevated in the inner reaction tube 204, passes above through the cylindrical space 210 formed between the inner reaction tube 204 and the outer reaction tube 205, and is emitted to the sub-exhaust pipe 4A (the HFV line 266) branched from the main exhaust pipe 1A. Also at the time of the unloading, in a similar way, the large amount of $N_2$ gas is introduced into the inner reaction tube 204, and is emitted to the sub-exhaust pipe 4A. Thus, the airflow at the large flow rate, which goes from the introduction side of the reaction gas toward the exhaust side thereof, is formed in the furnace, and together with the airflow, the particles which occur in the furnace at the time of the wafer loading and the time of the wafer unloading are emitted to the outside of the furnace.

In this case, it is preferable that the flow rate of the exhaust in the HFV line 266 be set larger than the flow rate of the exhaust in the main exhaust line 263 at the time of the reduced-pressure CVD processing for the substrates. Moreover, it is preferable that the exhaust from the HFV 266 be not the vacuum exhaust but exhaust under pressure larger than the pressure at the time of the reduced-pressure CVD processing for the substrates. The pressure at the exhaust is preferably 400 Pa or more, and more preferably, the atmospheric pressure (101,325 Pa). The reason is as follows. When the exhaust is performed under a reduced pressure by the vacuum pump 246 such as the turbo molecular pump 246A, it is difficult to effectively emit the particles as a molecule flow even if the flow of the $N_2$ gas is made fast because $N_2$ molecules roughly exist in the gas flow and a mean free path of the $N_2$ particles is large. This is because the particles which do the Brownian movement by heat have a high probability to do a gravity drop without being brought into contact with the $N_2$ molecules. In terms of this point, in the case of the atmospheric pressure exhaust, though the gas flow rate is made as slow as, for example, approximately 10 cm/min, the $N_2$ molecules densely exist in the gas flow and easily collide with the particles, and accordingly, it is easy to emit the particles. This is just because a wind of the $N_2$ gas blows in the furnace from the introduction side toward the exhaust side, and the particles come to be blown out to the outside of the furnace together with the wind concerned.

As described above, by the exhaust under the pressure larger than the pressure at the time of the substrate processing, the particles can be effectively emitted to the outside of the furnace, and thus, an increase of the particles, which is accompanied with an increase of a thickness of the deposited films, is restricted, and the adhesion of the particles onto the surfaces of the wafers at the time of the wafer loading and the time of the wafer unloading can be reduced to a great extent.

Moreover, at the times of the wafer loading and the wafer unloading when the throat opening is opened and the atmosphere flows into the furnace, the inert gas such as the $N_2$ gas is introduced, and the flow of the inert gas is made in the furnace. Accordingly, the inside of the furnace can be set at an inert gas atmosphere, and oxidation of the surfaces of the wafers 200 can also be prevented.

FIG. 2 is an explanatory view showing, in the case of performing the SiN film forming for the wafers, a comparison in change of the number of particles between the case of performing the exhaust by the HFV line at the times of the wafer loading and the wafer unloading (with the HFV) and the case of not performing the exhaust by the HFV line at the times of the wafer loading/wafer unloading (without the HFV). It is seen that, though the counted number of particles was 350 pieces per wafer or more in the case of not performing the exhaust by the HFV line, the number of particles is radically reduced to near ten pieces in the case of performing the exhaust by the HFV line 266. As described above, in order to emit the particles generated owing to the film crack in the furnace, the exhaust under the pressure of 400 Pa or more by the HFV line, for example, the exhaust under the atmospheric pressure thereby is effective.

Note that film forming conditions (common to "with the HFV line" and "without the HFV line") in a comparison experiment between the case of performing the exhaust by the HFV line and the case of not performing the exhaust thereby, which is shown in FIG. 2, and inert gas introduction/exhaust conditions (only in "with the HFV line") at the times of the wafer loading/wafer unloading, are as follows.

(1) Film forming conditions (common to "with the HFV line" and "without the HFV line")
  Film type: SiN
  Reaction gas $SiH_2Cl_2$: 30 to 100 sccm
  Reaction gas $NH_3$: 300 to 900 sccm
  In-furnace temperature(film forming temperature): 750° C.
  In-furnace pressure: 10 to 100 Pa (2) Inert gas introduction/exhaust conditions at the times of the wafer loading/wafer unloading (only in "with the HFV line")
  Introduction rate of $N_2$ gas: 20 to 200 L/min
  Exhaust flow rate of $N_2$ gas: approximately equal to the introduction rate
  Exhaust pressure: 40 mm $H_2O$ or more (400 Pa or more)
  Diameter of particles to be counted: Ø0.13 μm or more As described above, according to this first embodiment, the second exhaust line 262 is added to the exhaust side, and the particles are adapted to be emitted under the pressure larger than the vacuum pressure as the pressure at the time of the substrate processing. Accordingly, the adhesion of the particles onto the wafers can be sufficiently restricted. Moreover, simultaneously, the inside of the furnace is set at the $N_2$ gas atmosphere at the time of the wafer loading or/and at the time of the wafer unloading, thus making it possible to effectively prevent the oxidation of the wafer surfaces. Hence, the increase of the particles and the oxidation of the wafer surfaces, which become problems in the case of forming the SiN films by the conventional vertical CVD apparatus, can be restricted effectively.

In the above-described first embodiment, the more the flow rate of the inert gas ($N_2$ gas) flown in the furnace is, the more preferable it is. However, based on the experience value, it is preferable to set the flow rate of the inert gas at 20 times or more the flow rate of the reaction gas, more preferably, at 100 times or more. Moreover, in order to smoothly move the particles out of the reaction chamber 201 against the gravity of the particles, it is preferable that the flow rate of the inert gas flown in the furnace be 20 L/min or more, more preferably, 100 L/min or more. It is desirable that the exhaust pressure at this time be 40 mm $H_2O$ or more (400 Pa or more), for example, the atmospheric pressure as described above. Moreover, because of the reason that the particles are to be smoothly moved out of the reaction chamber and that the heat in the heated reaction chamber is not to be taken away too much, it is preferable that the flow rate of the inert gas flown in the furnace be 20 to 200 L/min, more preferably, 100 to 200 L/min. Furthermore, it is preferable that the flow rate of the inert gas flown in the furnace be 100 to 150 L/min. This is because, when an upper limit of the flow rate of the inert gas flown in the furnace is set at 150 L/min, facility cost can be suppressed from being expensive, and in addition, excessive lowering of the temperature in the reaction chamber owing to the introduction of the inert gas of the normal temperature can be restricted. In these cases, the capacity of the reaction chamber 201 is, for example, 30 L to 120 L.

Moreover, as the inert gas for use, it is preferable to use $N_2$ for the most common use when the type of the film to be formed is SiN and the particle size is, for example, an order of 0.1 μm to 0.5 μm. However, when the particle size becomes an order of 0.5 μm or more because the type of the film to be formed differs and so on, it is preferable to use other gas such as He gas and Ar gas, of which molecules are larger than those of $N_2$.

Moreover, the exhaust flow rate of the second exhaust line 262 may be set larger than the flow rate of the inert gas introduced from the gas introduction line 240. When the exhaust flow rate of the second exhaust line 262 exceeds the flow rate of the inert gas as described above, there is a possibility that the wafers 200 are oxidized because the atmosphere is absorbed into the reaction chamber 201. Hence, when it is not preferable that the wafers be oxidized, it is recommended to set the exhaust flow rate of the second exhaust line 262 at an exhaust flow rate substantially equal to the flow rate of the inert gas or at an exhaust flow rate somewhat smaller than the flow rate of the inert gas. However, when the wafers 200 may be oxidized, it is preferable to set the exhaust flow rate of the second exhaust line 262 to be larger than the flow rate of the inert gas. This is because the particles can be more effectively emitted to the outside of the reaction chamber 201 together with the atmosphere. A preferable range of the exhaust rate is 20 L/min to 200 L/min.

Moreover, as shown in FIG. 6, it is preferable that the second exhaust line 262 communicate with exhaust equipment 270 of the building-accompanying facility which performs the exhaust at the atmospheric pressure. In general, in a semiconductor manufacturing factory, the exhaust equipment 270 of which exhaust flow rate is large is provided in the building-accompanying facility. Moreover, in the semiconductor manufacturing factory, a plurality of the processing furnaces is arrayed. Hence, all of the second exhaust lines 262 of the plurality of processing furnaces are connected to the exhaust equipment 270. The exhaust from each second exhaust line 262 can be emitted by using the exhaust equipment of which exhaust flow rate is large, the exhaust equipment being incorporated in the building-accompanying facility. Accordingly, the exhaust of which exhaust flow rate is larger than that of the first exhaust line 261 can be performed surely and easily. Note that, in order to ensure a predetermined exhaust flow rate, a blower 262 may be inserted according to needs into the exhaust line 262 communicating with the exhaust equipment 270 of the building-accompanying facility.

Moreover, in the above-described embodiment, limitedly to the time of the wafer loading and the time of the wafer unloading during the period while the reaction chamber is being opened, a large amount of flow of the $N_2$ gas, which goes from the gas introduction line 240 side toward the exhaust lines 260 and 262 side, is formed in the furnace. This is because the members such as the O-ring constructing the exhaust line can be protected because a period while the second exhaust line 262 is being exposed to emitted heat is shortened as compared with the case of performing the exhaust by the second exhaust line 262 while introducing the inert gas from the gas introduction line 240 into the reaction chamber 201 continuously during all the period while the reaction chamber is being opened. Moreover, this is because a consumption of the $N_2$ gas can be reduced. However, if there are not such limitations, the $N_2$ gas may be flown during all the period while the reaction chamber is being opened.

Moreover, in the above-described first embodiment, the exhaust by the HFV line at the times of the wafer loading/wafer unloading is applied to the processing furnace including the boat 217 on which the wafers 200 are charged in a horizontal attitude at multi-stages in the reaction chamber 201. The reason is as follows. Since the inside of the reaction chamber 201 is exhausted from the second exhaust line 262 of which exhaust flow rate is larger than that of the first exhaust line 261, the particles can be effectively emitted even from such a large-capacity reaction chamber as housing the boat 217 on which the wafers 200 are charged at the multi-stages, and accordingly, the adhesion of the particles onto the substrates can be reduced at any stage of the boat 217. However, without being limited to this, the present invention can also be applied to a processing furnace of a substrate processing apparatus for sheets, which holds one or two to three pieces of the wafers in the reaction chamber. In this case, the capacity of the reaction chamber is not so large. A capacity range from the reaction chamber which houses one substrate to the reaction chamber which houses many substrates is 30 L to 120 L.

Moreover, this embodiment is applied to the processing furnace composed of the double reaction pipe including the outer reaction tube 205 and the inner reaction tube 204 in the reaction chamber 201. In the case of the processing furnace composed of the double reaction pipe, when the inert gas is supplied from the lower portion of the inner reaction tube 204, the inert gas is elevated in the reaction pipe 204, and is exhausted through the cylindrical space 210 formed between the outer reaction tube 205 and the inner reaction tube 204. Hence, in order to emit the particles generated in the inner reaction tube 204 to the outside of the furnace, it is necessary to elevate the particles toward a direction against the gravity and to let the particles go beyond the inner reaction tube 204, and it is therefore difficult to emit the particles. However, according to this embodiment, the purging at the atmospheric pressure is performed by the inert gas at the large flow rate, and accordingly, the number of molecules and the number of atoms, which are capable of carrying foreign objects, are large, and energy for carrying the foreign objects is large. Accordingly, even in the case of the processing furnace with the double-pipe structure, which is difficult to emit the particles, the particles can be emitted easily.

Moreover, with regard to the supply of the inert gas at the time of the exhaust by the HFV line, in the above-described embodiment, the description has been made of the method of exhausting the inside of the reaction chamber 201 by the HFV line 266 while supplying $N_2$ from the gas introduction line 240 into the reaction chamber 201. However, if the gas such as $N_2$ and a clean air is flown to a transfer area (the boat unloading position) at the times of the boat loading/boat unloading, even if N₂ is not supplied from the gas introduction line 240 into the reaction chamber 201, an effect similar thereto can be obtained only by exhausting the inside of the reaction chamber 201 by the HFV line 266.

For example, as shown in FIG. 3, a preliminary chamber 271 such as a load-lock chamber and a N₂ purge box is conjoined to the reaction chamber 201. The preliminary chamber 271 includes a N₂ supply line 272. A N₂ gas supply source 275 is connected to the N₂ supply line 272 through an MFC 274 and a gate valve 273. The N₂ gas of which flow rate is controlled by the MFC 274 is adapted to be introduced from the N₂ supply line 272 into the preliminary chamber 271 and to be exhausted from an exhaust line 276.

Hence, if the inside of the reaction chamber 201 is adapted to be exhausted by the HFV line 266 while flowing N₂ into the preliminary chamber 271 at the times of the boat loading/boat unloading, N₂ in the preliminary chamber 271 will be flown into the reaction chamber 201 even if N₂ is not supplied from the gas introduction line 240 into the reaction chamber 201, and accordingly, an effect similar thereto can be obtained. In this case, the inert gas introduction from the gas introduction line 240 and from the preliminary chamber 271 may be performed concurrently. In this case, the total flow rate of the inert gas is set approximately within 20 L/min to 200 L/min.

Moreover, if a clean air unit or the like is installed on the transfer area (the boat unloading position), and the inside of the reaction chamber is exhausted by the HFV line 266 while flowing the clean air to the transfer area at the times of the boat loading/boat unloading, then the clean air supplied to the transfer area (the boat unloading position) will be flown into the reaction chamber 201 even if N₂ is not supplied from the gas introduction line 240 into the reaction chamber 201, and accordingly, an effect similar thereto can be obtained.

Note that, if the preliminary chamber 271 is conjoined to the reaction chamber 201, the oxidation of the Si wafers can also be prevented effectively. Specifically, in this embodiment, since the N₂ gas at the large flow rate is flown into the furnace in the wafer loading step or/and in the wafer unloading step, the atmosphere becomes entangled from the throat opening, and sometimes, the oxidation of the wafer surfaces becomes a problem. For example, in the case of forming WSi films as base films on the Si wafers in an upstream step, the Si wafers are prone to be oxidized. In such a case, the load-lock chamber or the N₂ purge box as the preliminary chamber 271 is conjoined to the processing chamber 201, and the wafer loading is performed under the N₂ gas atmosphere. In such a way, the entanglement of the atmosphere at the throat opening is prevented, and an increase of the oxidation of the wafer surfaces, for example, an increase of natural oxide films of the WSi films (tungsten silicide films) processed in the upstream step can be prevented effectively.

Moreover, in this embodiment, the description has been made of the case where the gas introduction line 240 is composed of one gas supply line shared between the lines for the reaction gases and the line for the inert gas. Specifically, as shown in FIG. 4, the gas introduction line 240 is branched on the upstream side so as to provide exclusive SiH₂Cl₂ line 241a, N₂ line 242a, and NH₃ line 243a, and is integrated on the downstream side, thereby being made into the shared line. Note that, to the SiH₂Cl₂ line 241a, a SiH₂Cl₂ gas supply source 241d is connected through an MFC 241c and a gate valve 241b. To the N₂ line 242a, a N₂ gas supply source 242d is connected through an MFC 242c and a gate valve 242b. To the NH₃ line 243a, a NH₃ gas supply source 243d is connected through a MFC 243c and a gate valve 243b.

Note that, as shown in FIG. 5, the lines for the reaction gases and the line for the inert gas are separated from one another, and are composed of two or more gas supply lines, and the inert gas may thereby be adapted to be introduced from the line for the inert gas. In this case, as shown in FIG. 5, the lines may be provided as a SiH₂Cl₂ line 241, a N₂ line 242, and a NH₃ line 243 separately from and independently of one another. If the inert gas N₂ is introduced from the exclusive line for the inert gas as described above, then the crack is avoided being generated on the NH₄Cl films adsorbed on the pipe inner walls of the lines for the reaction gases, and the particles are avoided from scattering.

As described above, according to this first embodiment, at the time of loading the wafers into the reaction chamber or/and at the time of unloading the wafers therefrom, the flow of the N₂ gas at the large flow rate is formed in the furnace by using the HFV line, the inside of the furnace is purged, and the particles generated in the furnace are thereby adapted to be emitted. Accordingly, the adhesion of the particles onto the wafers can be reduced. Moreover, the introduction flow rate of the inert gas and the exhaust flow rate thereof are set substantially equal to each other, thus also making it possible to effectively prevent the oxidation of the wafer surfaces at the time of loading the wafers into the reaction chamber or/and at the time of unloading the wafers therefrom.

The step where this embodiment becomes particularly effective is the boat loading step rather than the boat unloading step. At the time of the boat loading, the temperature in the reaction furnace is varied more largely than that at the time of the boat unloading (refer to FIG. 10). For example, when attention is paid to the CL zone of FIG. 10, it is seen that, while a variation range of the in-furnace temperature at the time of the boat unloading is approximately 10° C., a variation range of the in-furnace temperature at the time of the boat loading is approximately 80° C., which is approximately eight times that at the time of the boat unloading. Therefore, at the time of the boat loading, a heat stress applied to the films adhered onto the wall surfaces is larger than that at the time of the boat unloading, and the film crack is prone to occur. Specifically, at the time of the boat loading, the films are more prone to be exfoliated, and the particles are more prone to be generated. This embodiment becomes particularly effective in the boat loading step where the particles are prone to be generated.

Moreover, a material of the reaction pipes and the boat, in which this embodiment becomes particularly effective, is as follows. SiC has a coefficient of thermal expansion, which is approximate to that of SiN, and accordingly, even if the in-furnace temperature is varied, a stress difference does not occur very much between SiC and SiN. Hence, when the reaction pipes and the boat are made of SiC, the particles are difficult to occur even if the in-furnace temperature is varied. As opposed to this, SiO₂ (quartz) has a large difference in coefficient of thermal expansion from SiN, and accordingly, a stress difference between SiO₂ and SiN is increased when the in-furnace temperature is varied. Hence, when the reaction pipes and the boat are made of SiO₂, the particles become prone to be generated when the in-furnace temperature is varied. As described above, the present invention becomes particularly effective in the case of forming the SiN film by using a combination of the members and the film forming, in which the particles are prone to be generated owing to the temperature variation, that is, by using the quartz-made reaction pipes and the boat.

FIG. 7 is a cross-sectional view of a reduced-pressure CVD processing furnace according to a second embodiment. A different point from that of the first embodiment is that a heating mechanism 233 is provided on the gas introduction line 240. Note that the same reference numerals are assigned to the same portions as the portions described by using FIG. 1, and a description thereof is omitted.

For example, the heating mechanism 233 can be composed of a heater, a heat exchanger, or the like, which heats the gas supply pipe 232 and heats the gas flowing therein. To the controller 120, (4) a function to heat-control the $N_2$ gas is further added in addition to the control functions (1) to (3) according to the first embodiment. Note that the function (4) may be controlled by providing a separate and different controller from the controller 120.

As shown in FIG. 7, when the boat is elevated up and the wafers are loaded, the throat shutter 218 is opened, and as shown by a black arrow, the $N_2$ gas preheated to the in-furnace temperature or to the vicinity thereof is introduced at a large flow rate into the furnace. Then, the $N_2$ gas elevated from the upper opening of the inner reaction tube 204 is made to pass through the cylindrical space 210, and is drawn by the HFV line 266, whereby the inside of the furnace is purged at the atmospheric pressure. Moreover, also at the time of lowering the boat and unloading the wafers, in a similar way, the $N_2$ gas preheated to the in-furnace temperature or to the vicinity thereof is exhausted by the HFV line 266 while being introduced at the large flow rate into the furnace as shown by the black arrow, whereby the inside of the furnace is purged at the atmospheric pressure.

As described above, when the $N_2$ gas is preheated to the in-furnace temperature or to the vicinity thereof in the case of purging the inside of the furnace with the $N_2$ gas, the temperature drop in the inside of the furnace can be reduced even if the inert gas is introduced into the furnace. Hence, the inside of the temperature can be maintained at a reaction chamber temperature at an idle time, and accordingly, the temperature drops of the wall surfaces of the reaction pipes and the like can be prevented even if the throat shutter 218 is opened at the time of the wafer loading, or even if the seal cap 219 opens the throat opening at the time of the wafer unloading.

Note that, when purging conditions at the times of the wafer loading/wafer unloading in this second embodiment are illustrated, the purging conditions are as follows. Note that film forming conditions are the same as those of the first embodiment.

Introduction rate of $N_2$ gas: 20 to 150 L/min
Exhaust flow rate of $N_2$ gas: equal to the introduction rate
Exhaust pressure: 400 Pa or more
Preheated temperature of $N_2$ gas: 600° C. or less As described above, according to the first and second embodiments of the present invention, at the time of the wafer loading or/and at the time of the wafer unloading, that is, only at the time when the reaction furnace is opened, the flow of the $N_2$ gas at the large flow rate is formed by using the HFV line 266. In such a way, the inside of the furnace can be purged in the atmospheric pressure state, and the particles 92 generated in the furnace can be emitted sufficiently. Moreover, after the film forming, the boat 217 is unloaded, the throat shutter 218 is closed, and the wafers 200 held on the boat 217 unloaded from the reaction furnace are subjected to cooling processing. For example, while the film forming temperature is approximately 780° C. in the nitride film, the in-furnace temperature during the cooling processing is maintained at the temperature of 600° C. to 780° C. at the time of the boat loading.

However, a third embodiment which will be described from now on is one adapted to unload the boat 217 and to close the throat shutter 218 after performing the film forming processing for the wafers 200 in the furnace, and to thereafter flow $N_2$ at the large flow rate into the furnace during the cooling of the wafers 200. In such a way, the particles 92 can be emitted more effectively. Specifically, during the cooling of the wafers 200, the temperature of the furnace is radically lowered to approximately 400° C. at a temperature drop rate of, for example, 20° C. /min (forcible cooling), whereby a large temperature drop is given to the inside of the furnace, and $N_2$ at the large flow rate is flown into the furnace (hereinafter, also referred to as "forcible cooling purge"). Specifically, the in-furnace temperature is radically lowered in a state where the wafers 200 are not housed in the furnace during the cooling of the wafers 200, whereby the heat stress is applied to the SiN films 90 deposited on the wall surfaces of the reaction pipes, and the crack is made to be generated forcibly, and the exfoliation of the films is made to be generated. Then, $N_2$ at the large flow rate is flown into the furnace, and the exhaust is performed therefor by using the HFV line 266. The inside of the furnace is purged in the atmospheric pressure state in such a way, thus making it possible to effectively emit the particles 92. Furthermore, while the SiN films deposited on the wall surfaces of the reaction pipes are exfoliated forcibly by controlling the temperature of the heating means 202, and the exhaust is performed therefor by flowing $N_2$ at the large flow rate, the throat shutter 218 is left closed at this time. Accordingly, there is no possibility that the particles 92 scatter and are adhered onto the wafers 200 held on the boat 217.

Hence, the third embodiment is further added to the first and second embodiments, thus making it possible to effectively emit the particles 92.

It is preferable that the period while the inside of the furnace is being exhausted by the HFV line while introducing the inert gas thereinto be the time of the boat loading in a period before the substrate processing. Moreover, in a period after the substrate processing, it is preferable that the period concerned be the time of the boat unloading, which has been described in the first and second embodiments. Furthermore, it is preferable that $N_2$ be continued to be flown continuously during a period from the time of the boat unloading until the end of the forcible cooling purge step described in the third embodiment.

Moreover, with regard to the exhaust flow rate, the exhaust flow rate by the HFV line at the times of the boat loading/boat unloading or the time of the forcible cooling purge is larger than the exhaust flow rate by the vacuum exhaust line at the time of the wafer processing. Note that the exhaust flow rate by the HFV line at the times of the boat loading/boat unloading or the time of the forcible cooling purge is the largest among those in the entire processing process from the boat loading to the boat unloading.

EXPLANATION OF REFERENCE NUMERALS

Figure 1:
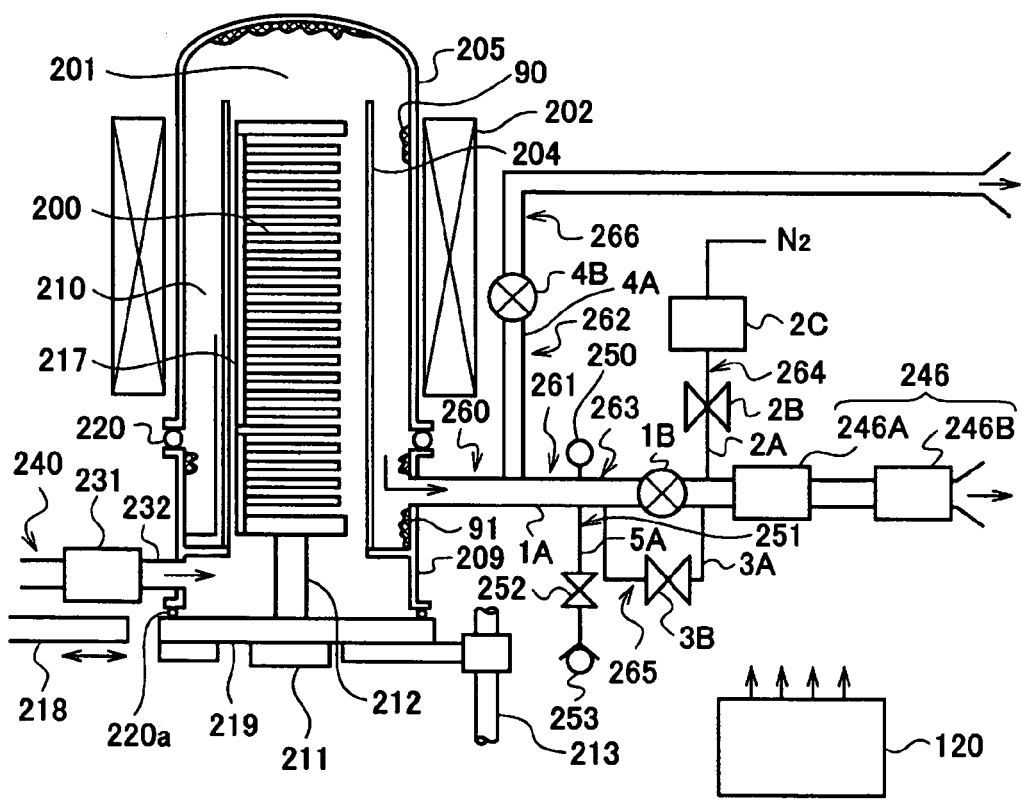
FIG. 1 is an explanatory view of a processing furnace constructing a substrate processing apparatus at a time of wafer processing in a first embodiment.
Figure 2:
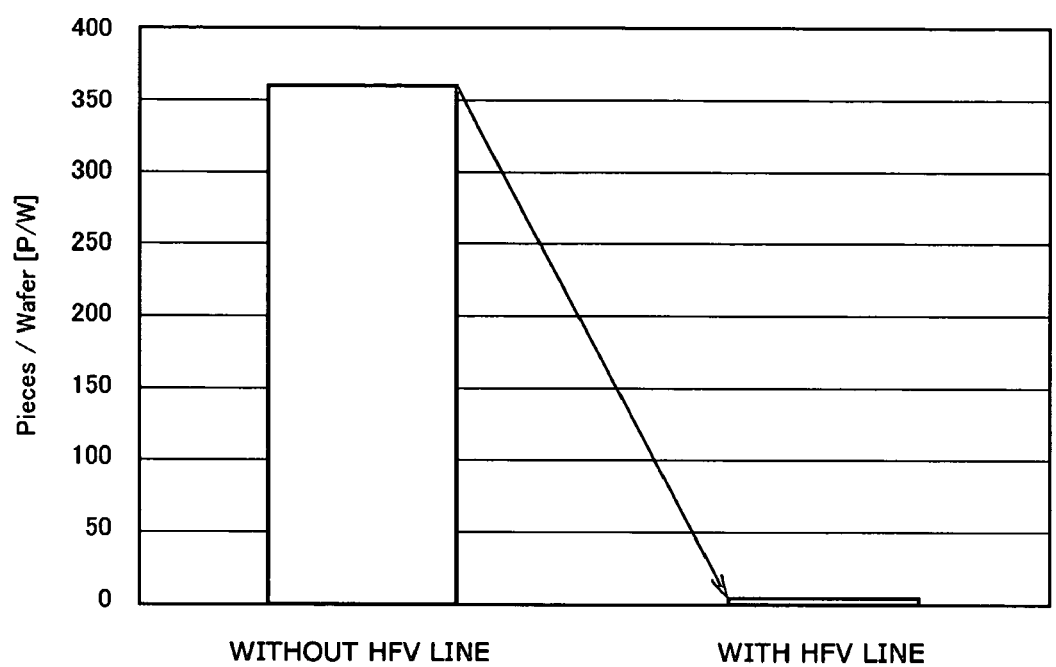
FIG. 2 is an explanatory view showing a comparison in change of the number of particles between a case of performing exhaust by an HFV line in the first embodiment (with HFV) and a case of not performing the exhaust by the HFV line (without the HFV).
Figure 3:
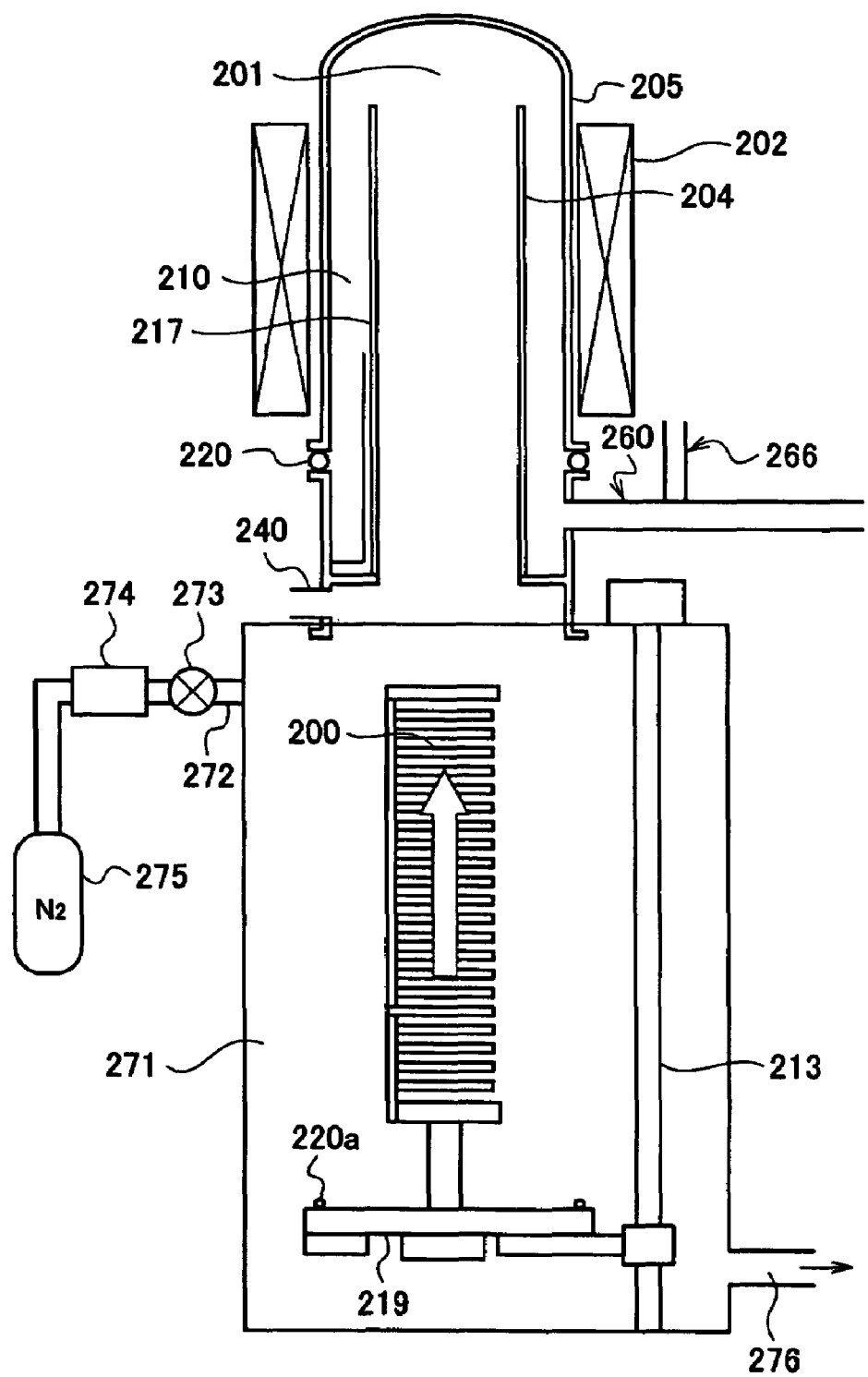
FIG. 3 is a view showing a modification example at a time of wafer loading in a case where a preliminary chamber is conjoined to the processing furnace in the first embodiment.
Figure 4:
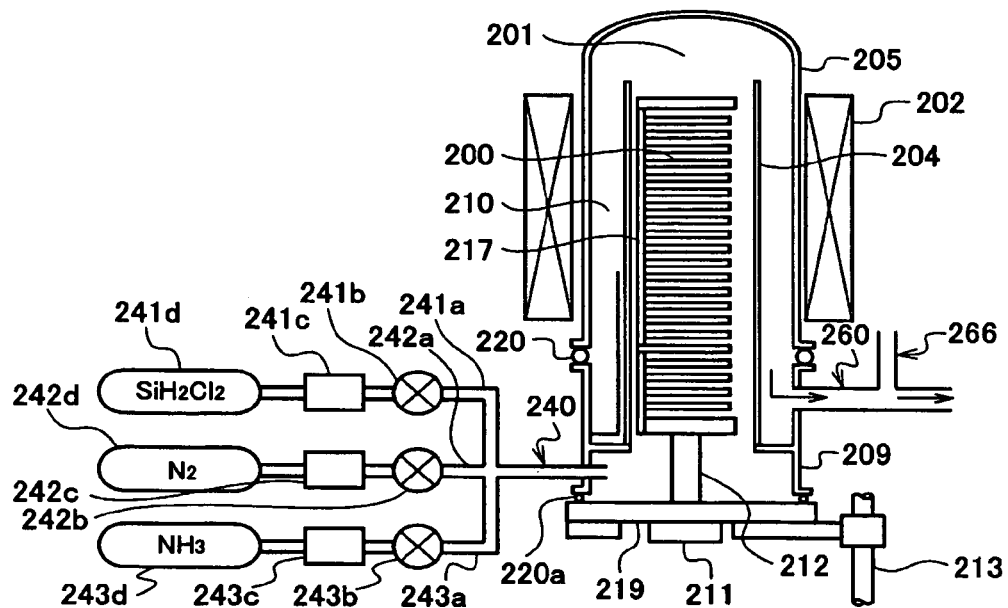
FIG. 4 is a specific explanatory view of a supply system in the first embodiment.
Figure 5:
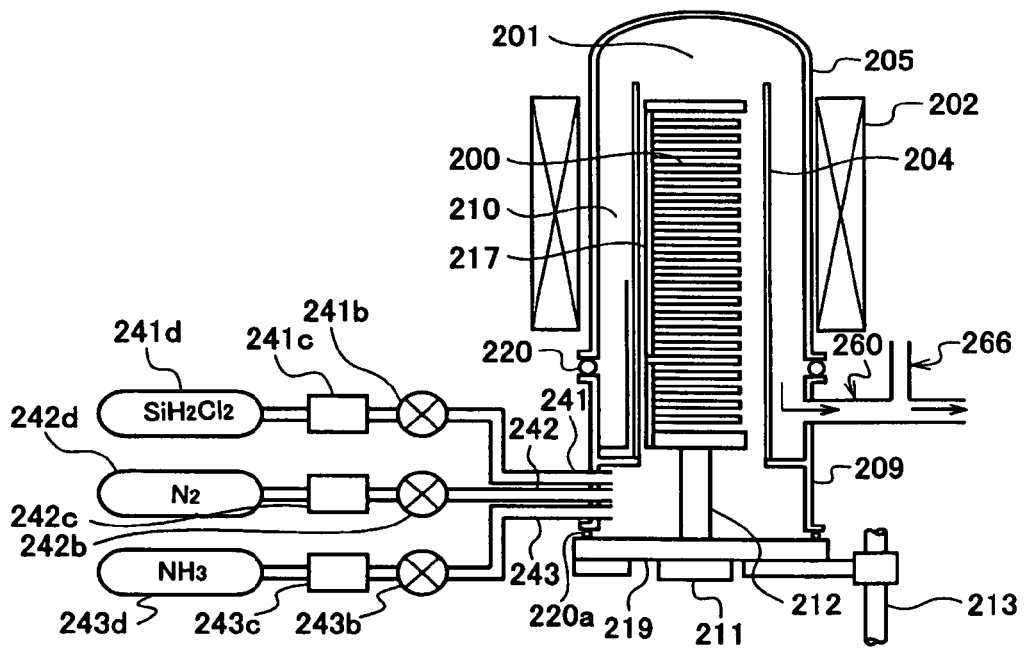
FIG. 5 is a view showing a modification example in a case where an inert gas introduction line in the first embodiment is provided separately from and individually of reaction gas introduction lines.
Figure 6:
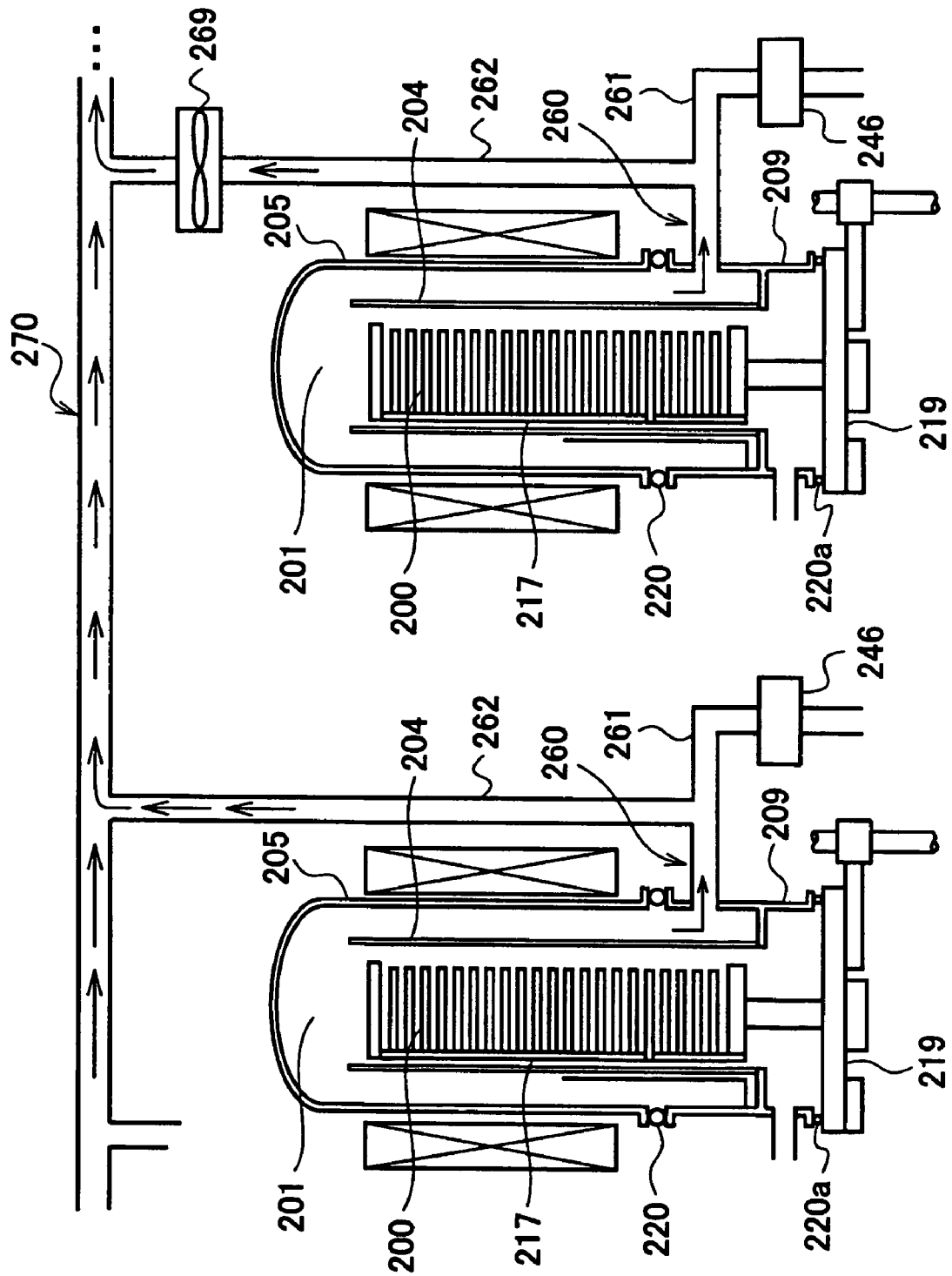
FIG. 6 is an explanatory view showing a case where a second exhaust line in the first embodiment communicates with exhaust equipment of a building-accompanying facility.
Figure 7:
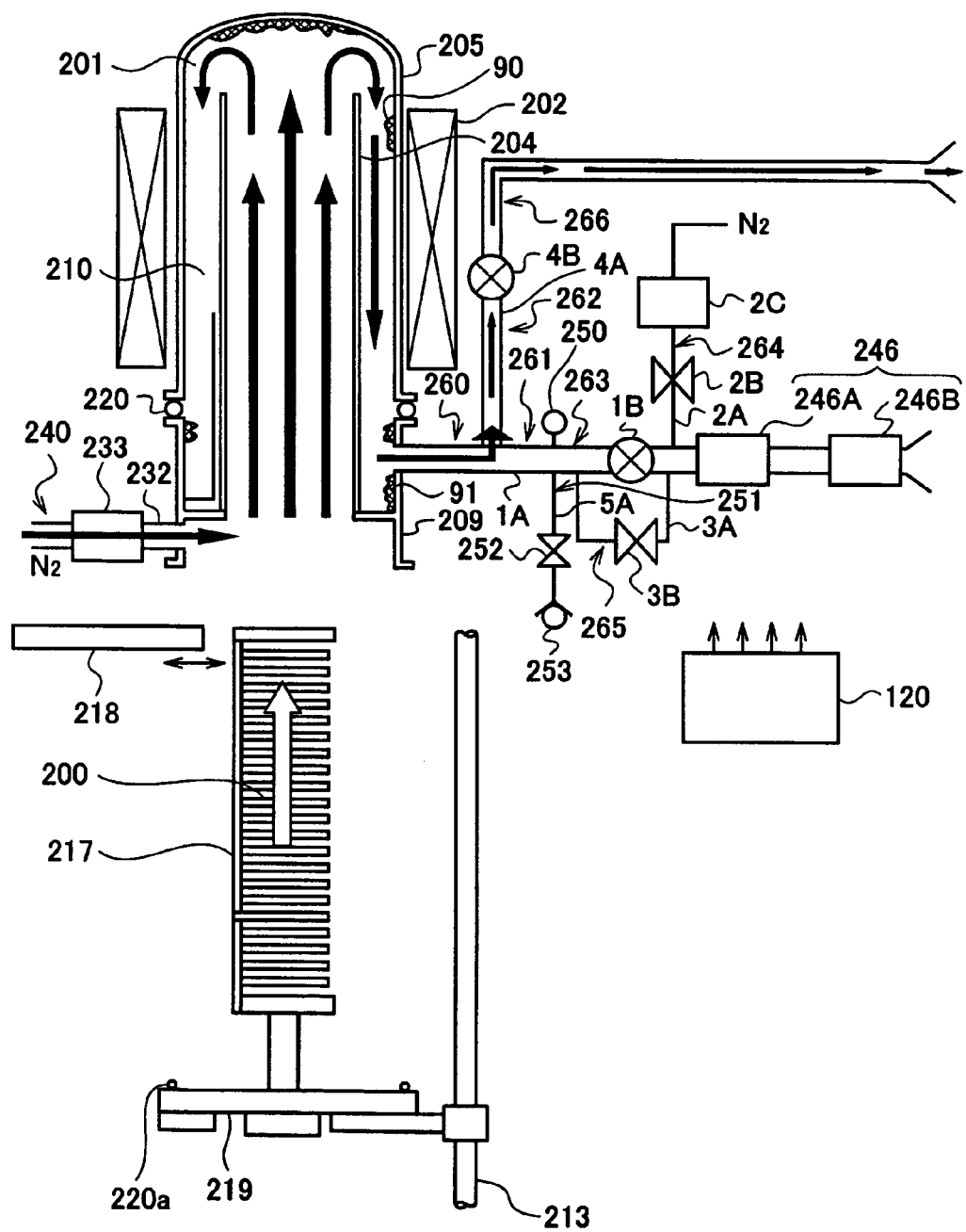
FIG. 7 is an explanatory view of a processing furnace constructing the substrate processing apparatus at the time of the wafer loading in a second embodiment.
Figure 8:
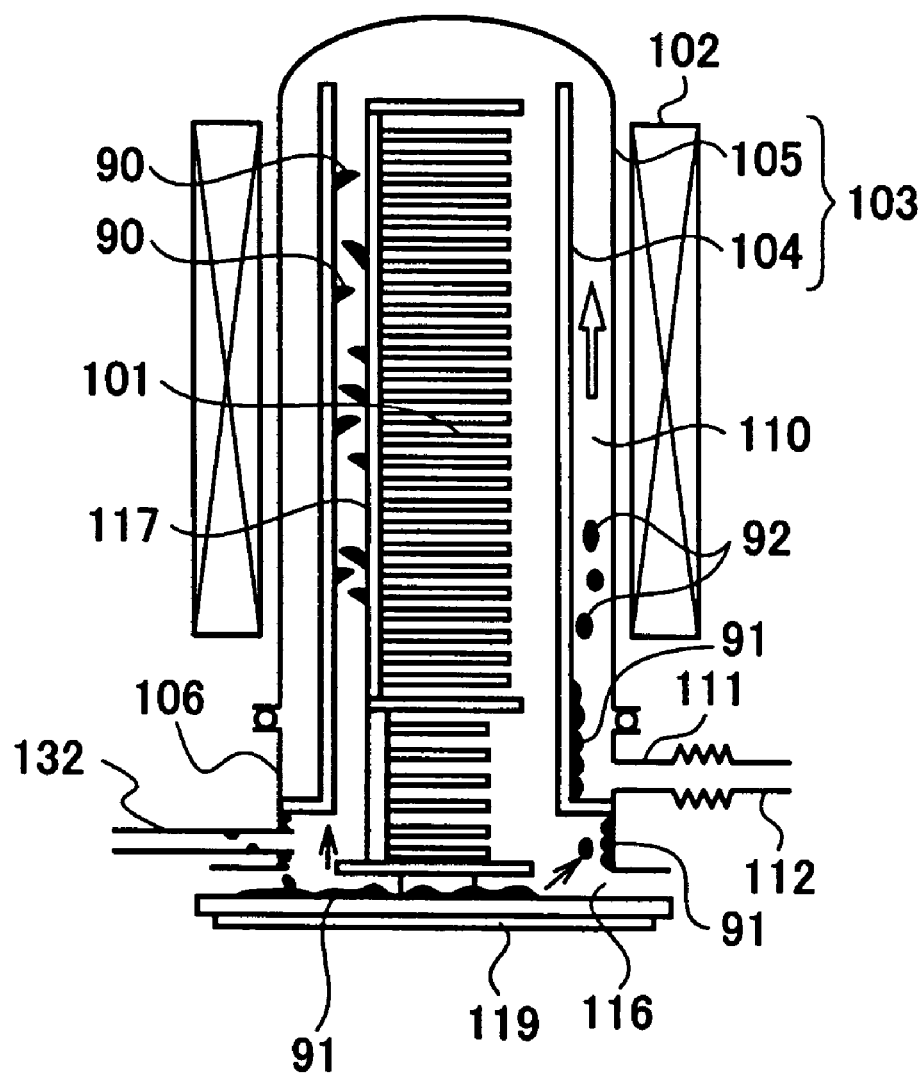
FIG. 8 is an explanatory view showing particle generation sources in a vertical CVD apparatus in a conventional example.
Figure 9:
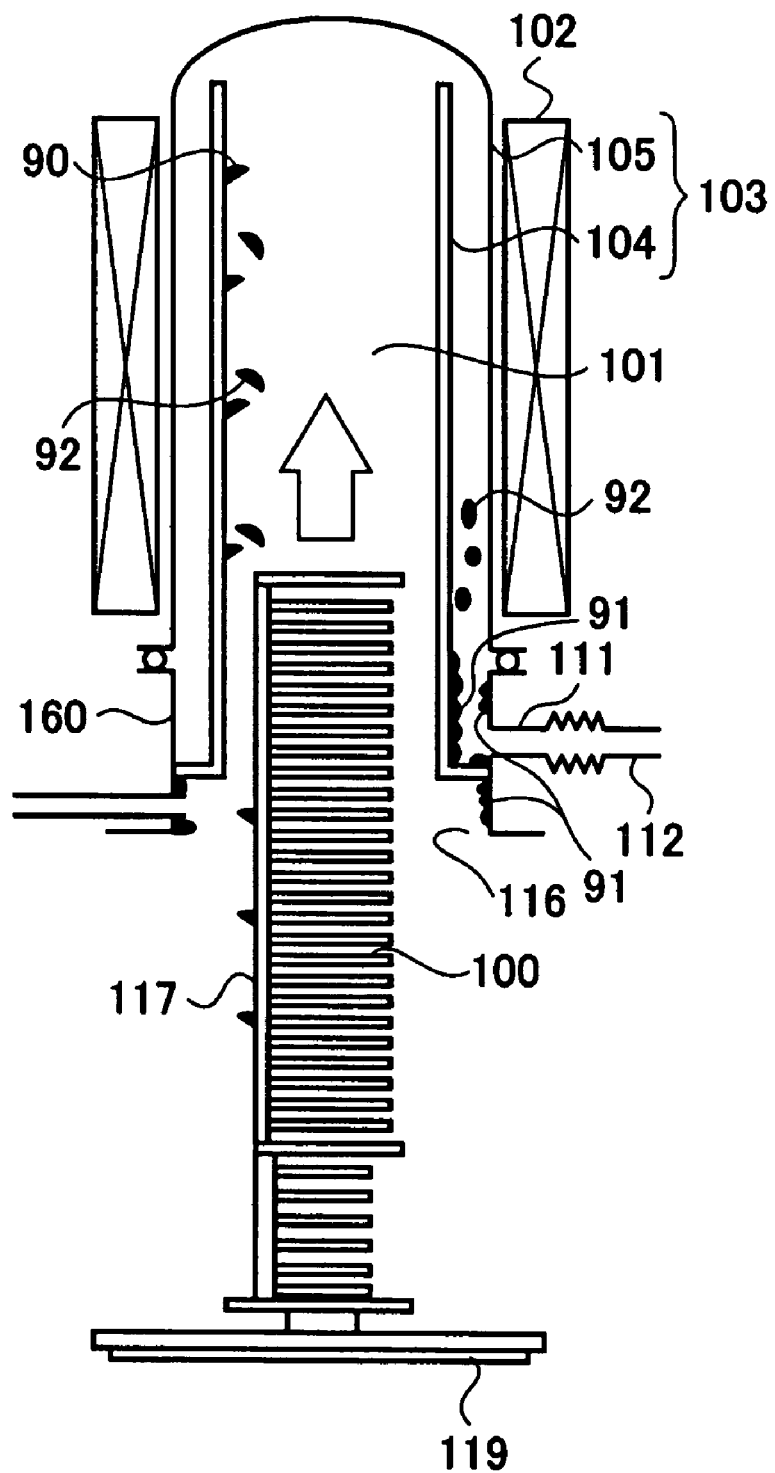
FIG. 9 is a view explaining a generation mechanism of the particles at the time of the wafer loading by elevating a boat in the conventional example.
Figure 10:
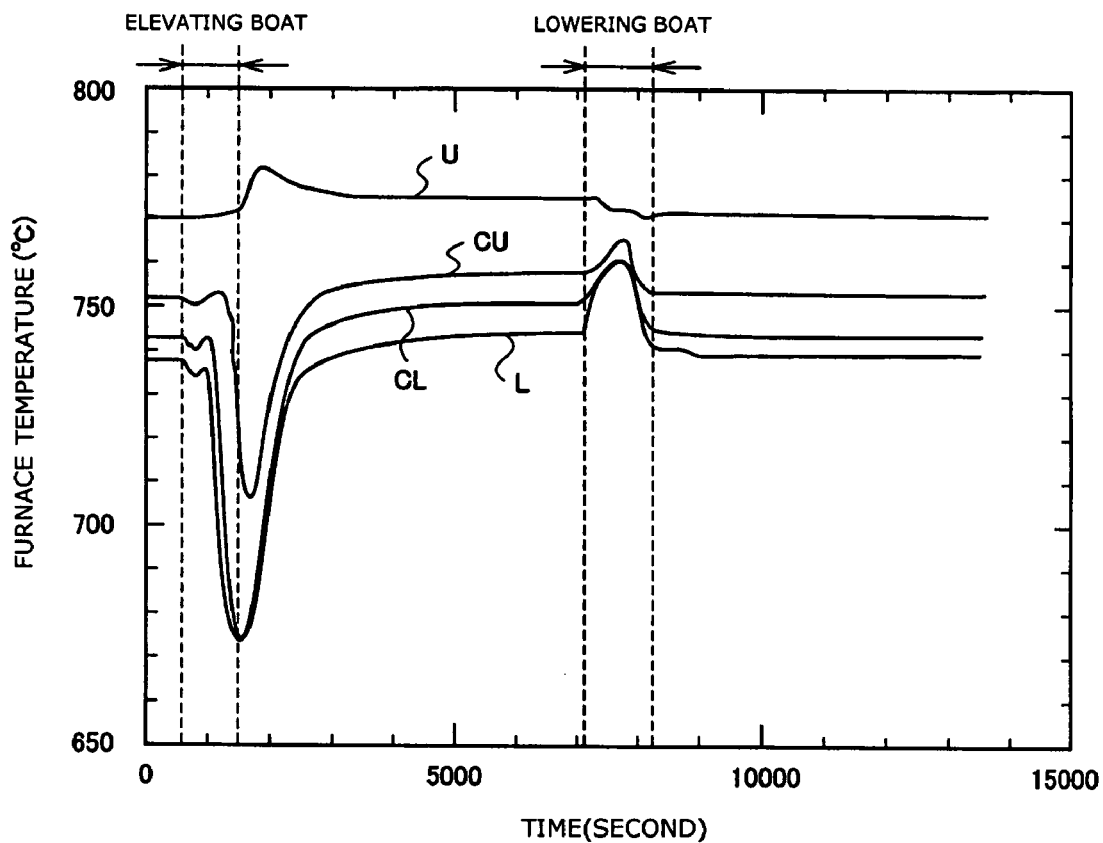
FIG. 10 is an explanatory view showing transitions of furnace temperatures by elevating/lowering a boat in the conventional example.

120 CONTROLLER
200 WAFER
201 REACTION CHAMBER (PROCESSING FURNACE)
240 GAS INTRODUCTION LINE
246 VACUUM PUMP
260 EXHAUST LINE
261 FIRST EXHAUST LINE
262 SECOND EXHAUST LINE
266 HFV LINE

The invention claimed is:

1. A method of manufacturing a semiconductor device, comprising the steps of:
    loading at least one substrate into a reaction chamber;
    introducing reaction gas into the reaction chamber, and exhausting an inside of the reaction chamber by a first exhaust line communicating with a vacuum pump, thereby processing the substrate; and
    unloading the processed substrate from the reaction chamber, wherein
    in the step of loading the substrate or/and in the step of unloading the substrate, the inside of the reaction chamber is exhausted by a second exhaust line having a larger exhaust flow rate than the first exhaust line, and
    the second exhaust line communicates with exhaust equipment of a building-accompanying facility.

2. A method of manufacturing a semiconductor device, comprising the steps of:
    loading at least one substrate into a reaction chamber;
    introducing reaction gas into the reaction chamber, and exhausting an inside of the reaction chamber by a first exhaust line communicating with a vacuum pump, thereby processing the substrate; and
    unloading the processed substrate from the reaction chamber, wherein
    in the step of loading the substrate or/and in the step of unloading the substrate, the inside of the reaction chamber is exhausted by a second exhaust line having a larger exhaust flow rate than the first exhaust line, and
    in the step of processing the substrate, a silicon nitride film is deposited on the substrate.

3. The method of manufacturing the semiconductor device according to claim 1, wherein, in the step of loading the substrate or/and in the step of unloading the substrate, the inside of the reaction chamber is exhausted under atmospheric pressure.

4. The method of manufacturing the semiconductor device according to claim 1, wherein, in the step of loading the substrate or/and in the step of unloading the substrate, the inside of the reaction chamber is exhausted by the second exhaust line while introducing inert gas into the reaction chamber.

5. The method of manufacturing the semiconductor device according to claim 4, wherein a supply flow rate of the inert gas is 20 L/min to 200 L/min.

6. The method of manufacturing the semiconductor device according to claim 1, wherein, in the step of loading the substrate or/and in the step of unloading the substrate, the inside of the reaction chamber is exhausted by the second exhaust line at a larger exhaust flow rate than the exhaust flow rate in the first exhaust line in the step of processing the substrate.

7. A method of manufacturing a semiconductor device, comprising the steps of:
    loading at least one substrate into a reaction chamber;
    introducing reaction gas into the reaction chamber, and exhausting an inside of the reaction chamber by a first exhaust line communicating with a vacuum pump, thereby processing the substrate; and
    unloading the processed substrate from the reaction chamber, wherein
    in the step of loading the substrate or/and in the step of unloading the substrate, the inside of the reaction chamber is exhausted by a second exhaust line having a larger exhaust flow rate than the first exhaust line while introducing inert gas into the reaction chamber, and
    a supply flow rate of the inert gas is set at 100 times or more than a supply flow rate of the reaction gas.

8. A method of manufacturing a semiconductor device, comprising the steps of:
    loading at least one substrate into a reaction chamber;
    introducing reaction gas into the reaction chamber, and exhausting an inside of the reaction chamber by a first exhaust line communicating with a vacuum pump, thereby processing the substrate; and
    unloading the processed substrate from the reaction chamber, wherein
    in the step of loading the substrate or/and in the step of unloading the substrate, the inside of the reaction chamber is exhausted by a second exhaust line having a larger exhaust flow rate than the first exhaust line while introducing inert gas into the reaction chamber, and
    a supply flow rate of the inert gas is 100 L/min or more.

9. A method of manufacturing a semiconductor device, comprising the steps of:
    loading at least one substrate into a reaction chamber;
    introducing reaction gas into the reaction chamber, and exhausting an inside of the reaction chamber by a first exhaust line communicating with a vacuum pump, thereby processing the substrate; and
    unloading the processed substrate from the reaction chamber, wherein
    in the step of loading the substrate or/and in the step of unloading the substrate, the inside of the reaction chamber is exhausted by a second exhaust line having a larger exhaust flow rate than the first exhaust line while introducing inert gas into the reaction chamber, and
    a supply flow rate of the inert gas is 100 L/min to 200 L/min.

10. A method of manufacturing a semiconductor device, comprising the steps of:
    loading at least one substrate into a reaction chamber;
    introducing reaction gas into the reaction chamber, and exhausting an inside of the reaction chamber by a first exhaust line communicating with a vacuum pump, thereby processing the substrate; and unloading the processed substrate from the reaction chamber, wherein in the step of loading the substrate or/and in the step of unloading the substrate, the inside of the reaction chamber is exhausted by a second exhaust line having a larger exhaust flow rate than the first exhaust line while introducing inert gas into the reaction chamber, and the exhaust flow rate of the second exhaust line is larger than a supply flow rate of the inert gas.

11. A method of manufacturing a semiconductor device, comprising the steps of:

loading at least one substrate into a reaction chamber;

introducing reaction gas into the reaction chamber, and exhausting an inside of the reaction chamber by a first exhaust line communicating with a vacuum pump, thereby processing the substrate; and unloading the processed substrate from the reaction chamber, wherein in the step of loading the substrate or/and in the step of unloading the substrate, the inside of the reaction chamber is exhausted by a second exhaust line having a larger exhaust flow rate than the first exhaust line while introducing inert gas into the reaction chamber, and the inert gas is heated and introduced into the reaction chamber.

12. A substrate processing apparatus comprising:

a reaction chamber which performs processing for at least one substrate;

at least one gas supply line which introduces gas into the reaction chamber;

a first exhaust line which exhausts an inside of the reaction chamber by a vacuum pump;

a second exhaust line having a larger exhaust flow rate than the first exhaust line which exhausts the inside of the reaction chamber; and a controller which makes a control to exhaust the inside of the reaction chamber by the second exhaust line at a time of loading the substrate into the reaction chamber or/and at a time of unloading the substrate from the reaction chamber, wherein the second exhaust line communicates with exhaust equipment of a building-accompanying facility.

13. A substrate processing apparatus comprising:

a reaction chamber which performs processing for at least one substrate;

at least one gas supply line which introduces gas into the reaction chamber;

a first exhaust line which exhausts an inside of the reaction chamber by a vacuum pump;

a second exhaust line having a larger exhaust flow rate than the first exhaust line which exhausts the inside of the reaction chamber;

a controller which makes a control to exhaust the inside of the reaction chamber by the second exhaust line at a time of loading the substrate into the reaction chamber or/and at a time of unloading the substrate from the reaction chamber; and a holder that supports a plurality of the substrates in a horizontal attitude at multi-stages in the reaction chamber.

14. A substrate processing apparatus comprising:

a reaction chamber which performs processing for at least one substrate;

at least one gas supply line which introduces gas into the reaction chamber;

a first exhaust line which exhausts an inside of the reaction chamber by a vacuum pump;

a second exhaust line having a larger exhaust flow rate than the first exhaust line which exhausts the inside of the reaction chamber; and a controller which makes a control to exhaust the inside of the reaction chamber by the second exhaust line at a time of loading the substrate into the reaction chamber or/and at a time of unloading the substrate from the reaction chamber, wherein the reaction chamber is composed of an outer reaction tube and an inner reaction tube.

15. A method of manufacturing a semiconductor device, comprising the steps of:

loading at least one substrate into a reaction chamber;

introducing reaction gas into the reaction chamber, and exhausting an inside of the reaction chamber by a first exhaust line communicating with a vacuum pump, thereby processing the substrate; and unloading the processed substrate from the reaction chamber, wherein in the step of loading the substrate or/and in the step of unloading the substrate, the inside of the reaction chamber is exhausted by a second exhaust line communicating with exhaust equipment of a building-accompanying facility while introducing inert gas into the reaction chamber.

16. A substrate processing apparatus comprising:

a reaction chamber which performs processing for at least one substrate;

an inert gas supply line that introduces gas into the reaction chamber;

a first exhaust line that exhausts an inside of the reaction chamber by a vacuum pump;

a second exhaust line that exhausts the inside of the reaction chamber by exhaust equipment of a building-accompanying facility; and a controller that performs control to exhaust the inside of the reaction chamber by the second exhaust line at a time of loading the substrate into the reaction chamber or/and at a time of unloading the substrate from the reaction chamber while introducing the inert gas into the reaction chamber by the inert gas supply line.

* * * * *